US010756739B1

(12) United States Patent
Coban

(10) Patent No.: US 10,756,739 B1
(45) Date of Patent: Aug. 25, 2020

(54) CHARGE PUMP AND ACTIVE LOOP FILTER WITH SHARED UNITY GAIN BUFFER

(71) Applicant: Silicon Laboratories Inc., Austin, TX (US)

(72) Inventor: Abdulkerim L. Coban, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/369,249

(22) Filed: Mar. 29, 2019

(51) Int. Cl.
*H03L 7/093* (2006.01)
*H02M 3/07* (2006.01)

(52) U.S. Cl.
CPC .............. *H03L 7/093* (2013.01); *H02M 3/07* (2013.01)

(58) Field of Classification Search
CPC ....... H01L 2924/00; H01L 2924/00014; H01L 2924/0002; H01L 2924/48465; H01L 2924/48091; H03L 7/093; H03L 7/0895; H03L 7/0896; H03L 7/0893
See application file for complete search history.

(56) References Cited

U.S. PATENT DOCUMENTS 7,548,120 B2 6/2009 Lam
7,570,105 B1 * 8/2009 Baek .................... H03L 7/0896 327/148
7,821,343 B1 10/2010 Wong
8,130,044 B2 3/2012 Bereza
2002/0145478 A1 * 10/2002 Chang .................... H03C 3/095 331/78
2004/0229574 A1 11/2004 Pfann
2006/0038596 A1 2/2006 Wang
2010/0291891 A1 11/2010 Ridgers
2016/0006442 A1 * 1/2016 Lahiri .................... H03L 7/093 327/157

OTHER PUBLICATIONS

Addo, R.F., "Charge Pumps for PLLs," downloaded from https://slideplayer.com/slide/5669461/, Mar. 13, 2019, 49 pages.
Cheng, S., et al., "Design and Analysis of an Ultrahigh-Speed Glitch-Free Fully Differential Charge Pump With Minimum Output Current Variation and Accurate Matching," IEEE Transactions on Circuits and Systems—II: Express Briefs, vol. 53, No. 9, Sep. 2006, pp. 843-847.
Kalenteridis, V., et al., "Analysis and Design of Charge Pumps for Telecommunication Applications," VLSI-SoC 2008, IFIP AICT 313, pp. 43-60, 2010.
Morgan, J., "Design of a Phase Frequency Detector and Charge Pump for a Phase-Locked Loop in 0.18μm CMOS," Presented to the faculty of the Department of Electrical and Electronic Engineering California State University, Sacramento, Spring 2017, 41 pages.

(Continued)

*Primary Examiner* — Sibin Chen
(74) *Attorney, Agent, or Firm* — Zagorin Cave LLP

(57) ABSTRACT

A unity gain buffer is shared by a charge pump and an active loop filter in a phase-locked loop. The charge pump uses the unity gain buffer to reduce current mismatch in the charge pump and the active loop filter uses the unity gain buffer in a circuit that increases the effective capacitance of the active loop filter.

20 Claims, 11 Drawing Sheets

(56) References Cited

OTHER PUBLICATIONS

Larsson, P., "An Offset-Cancelled CMOS Clock-Recovery/Demux with a Half-Rate Linear Phase Detector for 2.5Gb/s Optical Communication," Bell Labs, ISSCC 2001 / Feb. 5, 2001, 3 pages.
Long, Prof. S., "Phase Locked Loop Circuits," UCSB/ECE Department, Apr. 27, 2005, downloaded from https://web.ece.ucsb.edu/~long/ece594a/PLL_intro_594a_s05.pdf, 46 pages.
Razavi, B., "Introduction to PLLs," Electrical Engineering Department, downloaded Mar. 7, 2019, from www.seas.ucla.edu/brweb/teaching/215C_W2013/PLLs.pdf, 30 pages.
Rives, M., "Intermediate Frequency (IF) Sampling Receiver Concepts," National Semiconductor, vol. IV, Issue 3, 2011, 6 pages.
U.S. Appl. No. 16/369,239, filed Mar. 29, 2019, entitled "PLL for Continuous-Time Delta-Sigma Modulator Based ADCS," to inventor Abdulkerim L. Coban.

* cited by examiner

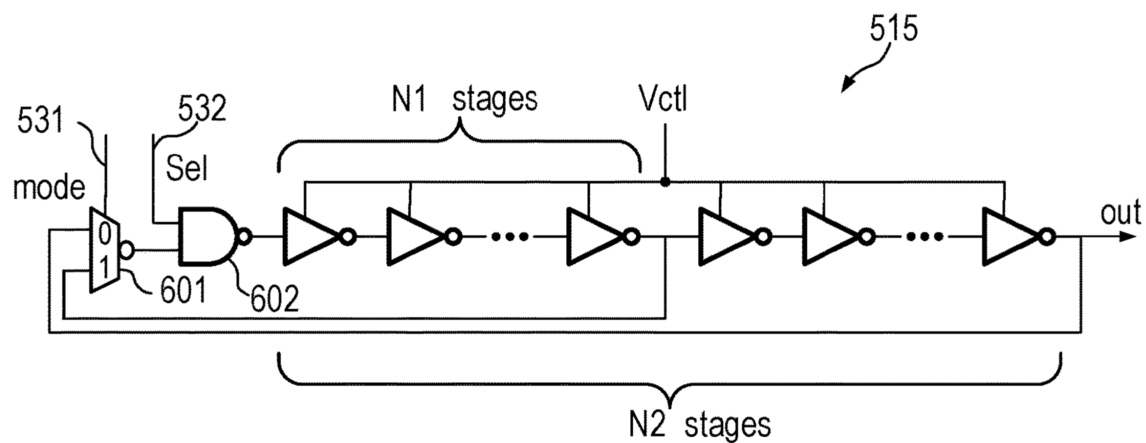
Fig. 6a
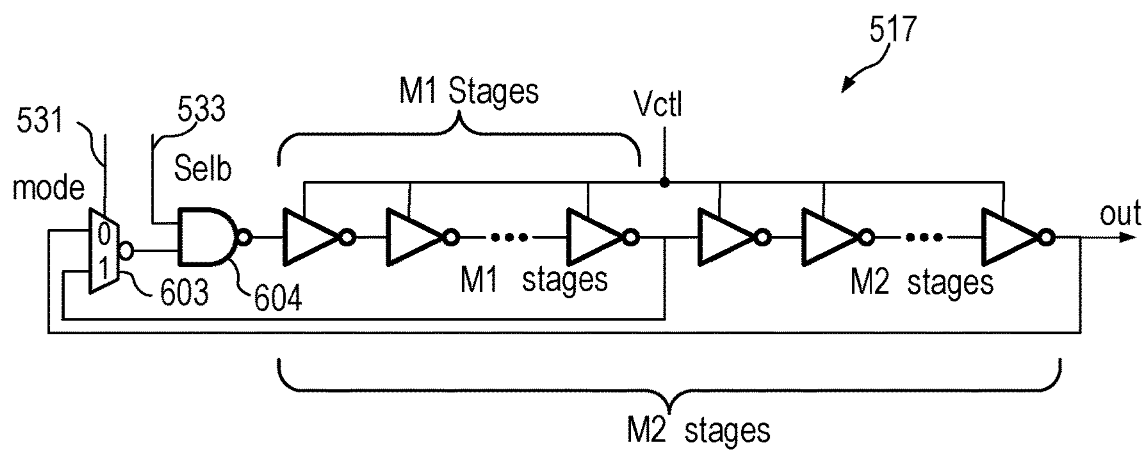
Fig. 6b
| VCO settings | | | | | |
|---|---|---|---|---|---|
| sel | mode | VCO | Oscillator configuration | Oscillation frequency | Application |
| 1 | 0 | $VCO_1$ | more inverter stages | low | low-rate, low jitter |
| 1 | 1 | $VCO_1$ | less inverter stages | high | full-rate, low jitter |
| 0 | 0 | $VCO_2$ | more inverter stages | low | low-rate, low power |
| 0 | 1 | $VCO_2$ | less inverter stages | high | full-rate, low power |
Fig. 7

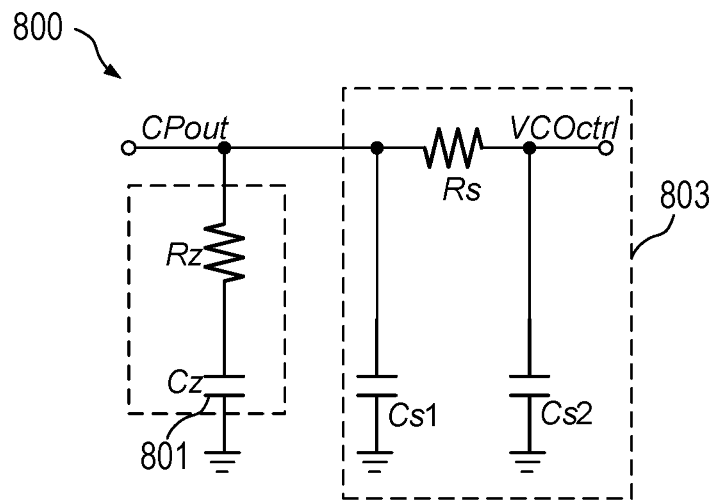
Fig. 8
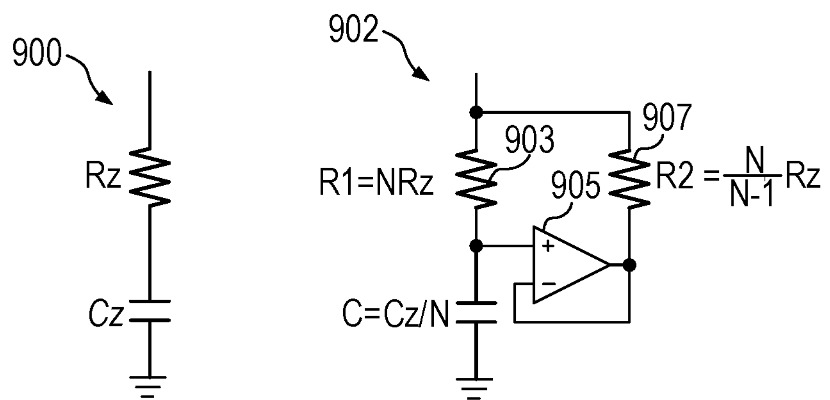
Fig. 9a
Fig. 9b

CHARGE PUMP AND ACTIVE LOOP FILTER WITH SHARED UNITY GAIN BUFFER

CROSS-REFERENCE TO RELATED APPLICATION(S)

This application relates to the application entitled "PLL for Continuous-Time Delta-Sigma Modulator Based ADCs", naming Abdulkerim L. Coban as inventor, U.S. patent application Ser. No. 16/369,239, filed Mar. 29, 2019, which application is incorporated herein by reference in its entirety.

BACKGROUND

Field of the Invention

This disclosure relates to generating clock signals and more particularly generating clock signals in a PLL with different power and jitter settings.

Description of the Related Art

Continuous-time delta-sigma modulator based analog to digital converters (ADCs) are widely used in radio frequency (RF) receiver (RX) applications. Typically, either higher-order delta-sigma modulator-based ADCs that use the reference clock (e.g., a crystal oscillator) or less complicated lower-order delta-sigma ADCs with high clock rates are employed. For the second case, in one solution clocks for the ADC are generated from divided down local oscillator (LO) clocks. However, the LO clock signal can change based on the tuned channel resulting in the ADC sampling frequency changing, thereby complicating modem design. Another approach uses a phase-locked loop (PLL) circuit as a clock multiplier unit for the ADC. Typically, these PLLs are not optimized for the delta-sigma ADCs and therefore consume high power and occupy large die area, increasing cost.

SUMMARY OF EMBODIMENTS OF THE INVENTION

A phase-locked loop (PLL) can be used to independently provide a fixed rate clock for the ADC in the RX signal chain, thereby simplifying modem design. In addition, it would be beneficial to reduce power consumed in the dedicated PLL.

In one embodiment, a phase-locked loop (PLL) includes a charge pump that provides a charge based on a difference between a reference signal and a feedback signal supplied by a phase and frequency detector. An active loop filter is coupled to an output node of the charge pump. A unity gain buffer is coupled to be used in the charge pump and in the active loop filter.

In another embodiment, a method for operating a phase-locked loop (PLL) includes generating signals indicating a difference between a reference signal and a feedback signal in a phase and frequency detector and supplying the signals indicating the difference to a charge pump. The method further includes using a unity gain buffer in the charge pump and using the unity gain buffer in an active loop filter and generating a filtered oscillator control signal using the charge pump and the active loop filter.

In another embodiment a PLL includes a phase and frequency detector (PFD) to provide PFD signals indicative of a difference between a reference signal and a feedback signal. A charge pump supplies a current to an output node of the charge pump based on the PFD signals. An active loop filter is coupled to the output node of the charge pump, the active loop filter providing an increased effective capacitance of a capacitor in the active loop filter. A unity gain buffer is coupled as part of the charge pump to reduce mismatch in the charge pump and the unity gain buffer is further coupled as part of the active loop filter. The charge pump includes a first transistor coupled between a first current source and the output node of the charge pump. A second transistor is coupled between a second current source and the output node of the charge pump. A third transistor is coupled between the first current source and a fourth transistor. The fourth transistor is coupled between the third transistor and the second current source. A positive input terminal of the unity gain buffer is coupled to the output node of the charge pump through a first resistor of the active loop filter. A second resistor of the active loop filter is coupled between the output node of the charge pump and an output terminal of the unity gain buffer. The capacitor of the active loop filter is coupled between the positive input terminal of the unity gain buffer and ground.

BRIEF DESCRIPTION OF THE DRAWINGS

The present invention may be better understood, and its numerous objects, features, and advantages made apparent to those skilled in the art by referencing the accompanying drawings.

FIG. 6*a* illustrates a block diagram of one of the PLL VCOs implemented as a ring oscillator according to an embodiment.

FIG. 6*b* illustrates a block diagram of another of the PLL VCOs implemented as a ring oscillator according to an embodiment.

FIG. 7 illustrates various possible settings for the VCOs illustrated in FIGS. 6*a* and 6*b*.

FIG. 8 illustrates a conventional loop filter topology.

FIG. 9*a* illustrates a passive loop filter.

FIG. 9*b* illustrates an active loop filter.

The use of the same reference symbols in different drawings indicates similar or identical items.

DETAILED DESCRIPTION

Figure 1A:
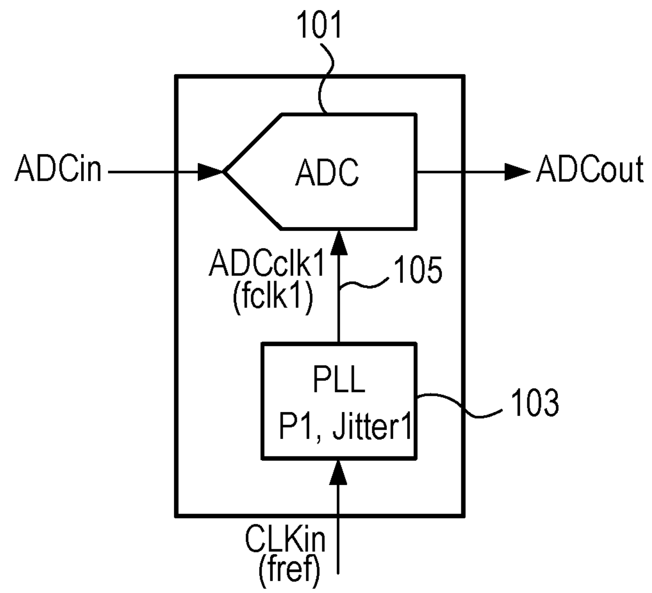
FIG. 1*a* illustrates a PLL supplying a clock signal to an ADC operating in full-rate mode.

Embodiments described herein provide a phase-locked loop (PLL) specifically targeted for clock generation for a continuous time delta sigma modulator ADC in an RF RX signal chain. For a given power budget, the PLL minimizes far-out phase noise at the expense of more relaxed close in phase-noise. The PLL can be used for other applications as well. Embodiments provide for a variable power dissipation PLL in which PLL power dissipation is selected based on requirements for the ADC. PLL power can be scaled e.g., based on the input signal strength to the RX signal chain and/or based on the clock rate needed by the ADC. Embodiments provide a fixed-rate clock to the ADC avoiding the complexity of using a divided down LO clock, thereby simplifying modem design.

In one embodiment, ADC clock rates are approximately 307.2 MHz for a 2 MHz bandwidth case. The ADC noise bandwidth of integration of 2 MHz is intended mainly for ZigBee® applications. An ADC clock rate around 153.6 MHz for bandwidths around 1 MHz is mainly intended for Bluetooth® applications, however both bandwidth settings can, in general, be used in with a wide range of data rates, e.g., 100 kbps to 2 Mbps FSK modulated signals and lower. Some embodiments assume a 38.4 MHz crystal frequency. Jitter limited signal to noise ratio (SNR) is mostly dependent on quantization noise folding in-band due to high-frequency jitter. As is known in the art, jitter is deviation of the clock signal edge from its ideal position. A higher clock rate demands lower jitter in the PLL (e.g., twice the frequency requires jitter to be two times lower, assuming the shape of the noise transfer function (NTF) is just frequency scaled, e.g., NTF scaled down by 2× by doubling the loop-filter capacitor sizes). Note that for a PLL intended for clock generation for continuous-time delta-sigma modulators, minimizing PLL high-frequency jitter is more important than overall jitter optimization and therefore embodiments can focus on efficient voltage control oscillator (VCO) design, keeping charge pump (CP), loop-filter, phase frequency detector (PFD), and feedback divider area and/or power low. Therefore, embodiments are driven to reduce high frequency jitter as low frequency jitter is not as important for certain applications. Embodiments utilize a clock frequency scaling scheme for full-rate and half-rate ADC operation. In half-rate mode the ADC clock frequency is scaled down by two times compared to the full-rate mode. However, frequency adjustment is not done through a VCO output divider. Instead the feedback divider ratio is scaled down by 2 and a lower power VCO is utilized in place of the VCO utilized for full-rate operation. Since the jitter requirements of the ADC is relaxed in half-rate mode that approach results in lower overall power consumption.

In addition, in principle, the jitter numbers can be relaxed when the input signal power is high, detected, e.g., by RX gain back-off. Low jitter is needed especially when the input signal level is close to sensitivity levels. The sensitivity level being the level at which acceptable signal detection occurs. For larger input signals (higher SNR), the allowed jitter can be higher. Therefore, embodiments use a PLL power scaling technique based on received signal power. When the signal chain gain is backed-off from its maximum value to at or below a threshold gain setting, the full-rate VCO is replaced with a low-power version (which has higher jitter). Utilizing the lower power VCO with higher jitter when signal power is high saves power.

Figure 1B:
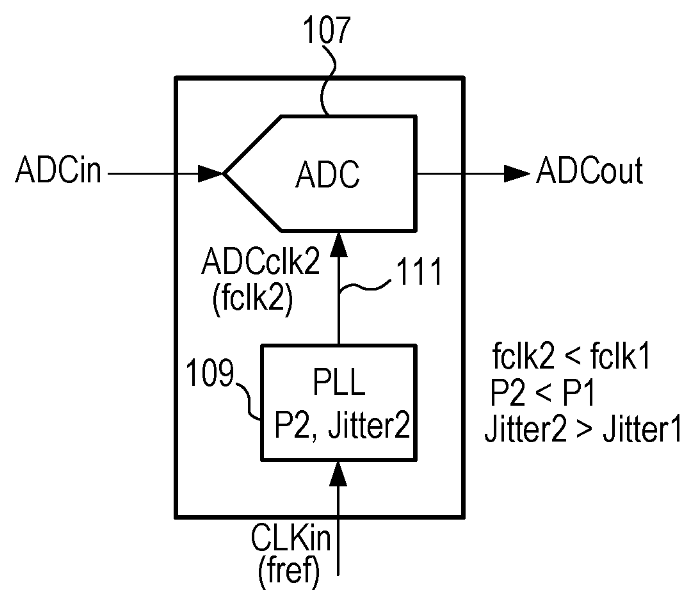
FIG. 1*b* illustrates a PLL supplying a clock signal to an ADC operating in less than full-rate mode.

If the ADC noise transfer function is 1-1 scaled when the clock frequency is lowered (e.g., fclk=320 MHz is lowered to fclk=160 MHz), the jitter specifications can be relaxed by the same or a similar amount. That is, with a lower clock frequency, twice as much jitter can be tolerated. That allows use of a lower power PLL generating an output signal having a higher jitter content. Referring to FIG. 1*a*, assuming the ADC 101 is at full rate a PLL 103 (also referred to as a clock multiplier unit (CMU) as it scales up the input reference clock) having a power utilization of P1 and a jitter specification of Jitter1 supplies ADC clock 105 that has a frequency of fclk1. The PLL 103 multiplies the reference clock signal CLKin, having a frequency of fref, to obtain ADC clock 105 with a frequency of fclk1. The PLL multiplies the reference clock CLKin by a multiple N based on the feedback divider. Thus, the frequency (fclk) of the ADC clock =N×fref. Referring to FIG. 1*b*, if the clock frequency requirement for ADC 107 is lowered, e.g., from 320 MHz to 160 MHz, a lower power PLL 109 supplies the ADC clock 111 (ADCclk2) having a frequency fclk2. The PLL 109 multiplies the reference clock signal CLKin, having a frequency of fref, to obtain ADC clock 111 with a frequency of fclk2. The PLL 109 has a power utilization of P2 and a jitter specification of Jitter2. The frequency fclk2<fclk1, and the power utilization P2<P1. Thus, a lower power PLL can be utilized that supplies a lower frequency ADC clock that has a higher jitter component. This jitter, as mentioned above, still meets the ADC requirements.

Figure 2C:
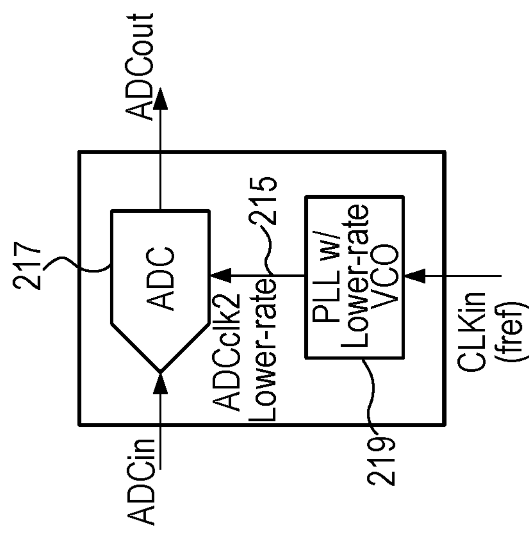
FIG. 2*c* illustrates a PLL with a lower-rate VCO supplying a lower rate clock signal to an ADC without the use of a divider.
Figure 2B:
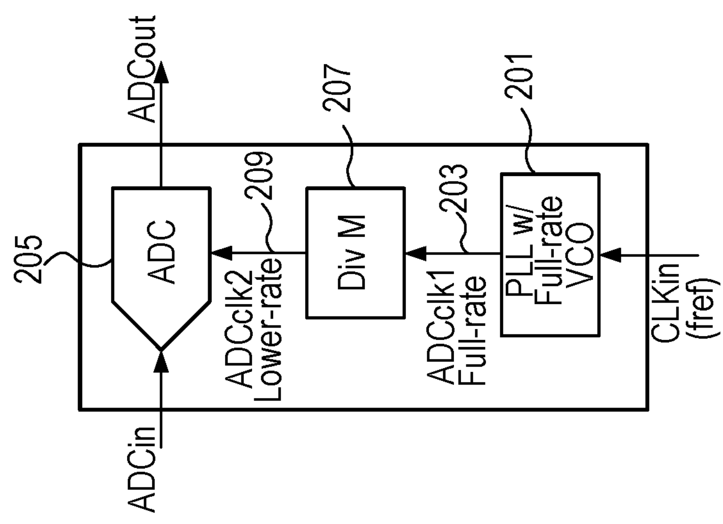
FIG. 2*b* illustrates a PLL with a full-rate VCO and a divider on the PLL output to supply a lower rate clock signal to an ADC.
Figure 2A:
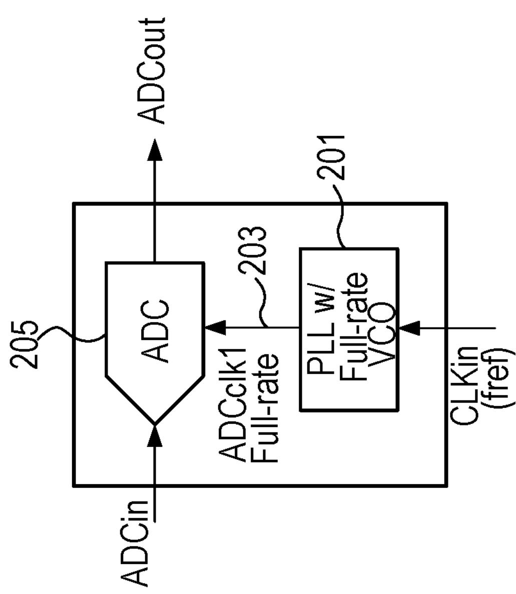
FIG. 2*a* illustrates a PLL with a full-rate VCO supplying a full rate clock signal to an ADC.

Referring to FIG. 2*a*, the illustrated embodiment utilizes a PLL 201 with a full rate VCO to supply a full rate ADC clock (ADCclk1) 203 to ADC 205. FIG. 2*b* illustrates that an output divider 207 can be used in conjunction with PLL 201 with a full rate VCO to supply an ADC clock (ADclk2) 209 that has a lower frequency than the ADC clock (ADCclk1) 203. However, the approach of FIG. 2*b* requires use of the PLL 201 with a full rate VCO and a divider 207, which consumes unnecessary power. FIG. 2*c* illustrates an embodiment that provides a lower rate clock 215 to ADC 217 directly from PLL 219 that utilizes a lower rate VCO. The PLL 219 uses a lower power VCO specifically designed to supply the lower rate ADC clock. The PLL 219 utilizes less power than the PLL 201 and the divider 207 is completely omitted from the embodiment shown in FIG. 2*c*, thus saving additional power.

Figure 3A:
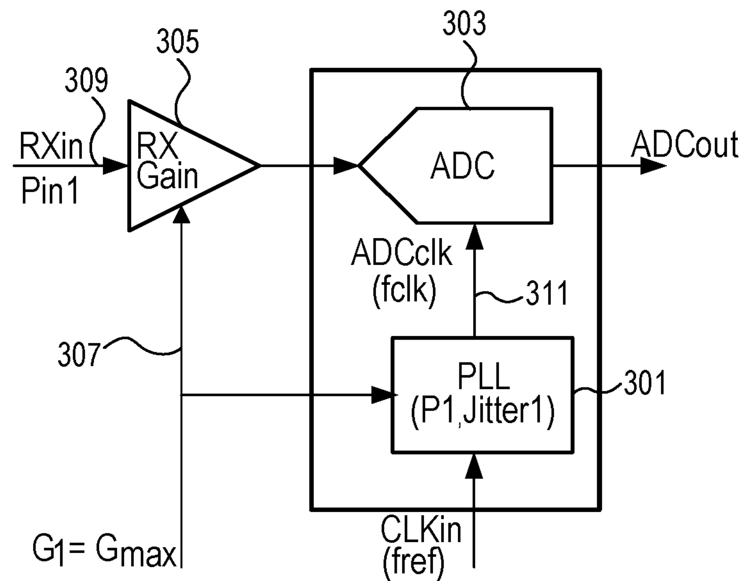
FIG. 3*a* illustrates an RX signal chain including an amplifier and an ADC in which the PLL supplying a clock signal to the ADC is configured for the amplifier gain being set to maximum.

In embodiments, PLL power scaling is based on the power of the input signal. Referring to FIG. 3*a*, the PLL 301 and ADC 303 function as part of the RX signal chain. The signal chain includes a receive amplifier 305 having a gain setting set by gain control signal 307. Note that gain block 305 represents the various gain blocks in a typical receiver (e.g., gains of the front-end passive network, low noise amplifier (LNA) and programmable gain amplifier (PGA)) as a single block for illustration purposes. The gain setting provides information indicating whether the power level of input signal 309 is close to a sensitivity level Psens or not. That is, if the input signal power Pin is such that the input signal is close to the minimum signal power sensitivity level Psens required to accurately sense the input signal, the gain setting for amplifier 301 is set to a maximum gain factor G1 (G1=Gmax). With the gain factor set to G1, which corresponds to the maximum gain, the system uses PLL 301 consuming power P1 and producing a clock signal with a jitter Jitter1.

Figure 3B:
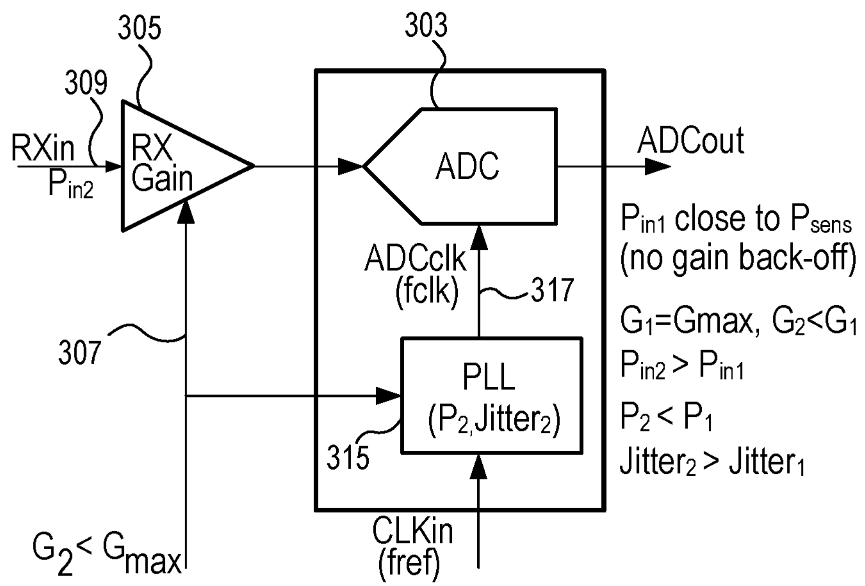
FIG. 3*b* illustrates an RX signal chain including an amplifier and the ADC in which the PLL supplying a clock signal to the ADC is configured for the amplifier gain being set to less than maximum.

However, if Pin>Psens (e.g., by at least several dBs), the amplifier gain signal 307 is reduced to reduce the gain of amplifier 305. The reduced gain setting indicates that the jitter specifications can be relaxed as overall Quantization+Thermal noise limited SNR is increased. That means that a clock signal with a greater jitter component can be tolerated by the ADC. In that circumstance, the system switches to a lower power VCO. Referring to FIG. 3*b*, if the gain for amplifier 305 is set at G2<Gmax, then the system uses PLL 315 with a power utilization of P2 and a jitter equal to Jitter2, Jitter2>Jitter1. In addition, the power of the input signal Pin2>Pin1, allowing a smaller gain factor G2<Gmax. The smaller gain factor indicates that the PLL 315 can use a VCO that produces a clock signal having a higher jitter component. Thus, the PLL 315 supplies a clock signal 317 having the same frequency (fclk) as clock signal 311 (FIG. 3*a*), but more jitter. The use of a higher jitter clock signal allows the use of a lower power PLL.

Figure 4:
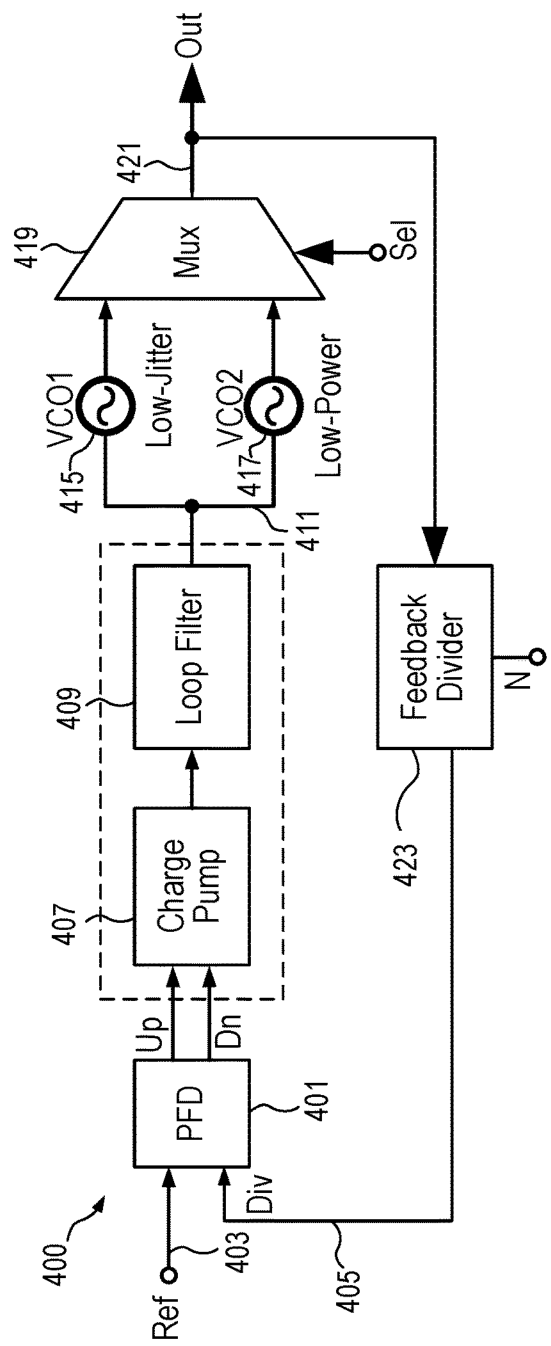
FIG. 4 illustrates a block diagram of a PLL with multiple VCOs according to an embodiment.

FIG. 4 illustrates a block diagram of a PLL (or CMU) 400 according to an embodiment. The PLL 400 includes a phase and frequency detector (PFD) 401 that compares the reference clock 403 to the feedback clock 405 and supplies an UP or DN signal based on the comparison to a charge pump 407. The charge pump supplies a loop filter 409, which supplies an oscillator control signal 411 to a low-jitter oscillator (VCO1) 415 and to a low power oscillator (VCO2) 417. A selector circuit 419 selects either the output of VCO1 415 or VCO2 417 as the output clock signal 421 for the PLL 400. Thus, rather than using separate PLLs, a single PLL selects between VCOs to achieve the desired power and jitter. The output clock signal 421 is fed back through feedback divider 423 to PFD 401. The feedback divider 423 divides the PLL output signal by N, and supplies the divided signal 405 to PFD 401. The selection of either VCO1 415 or VCO2 417 as the output clock signal depends on the proximity of the input signal power to the sensitivity level and/or whether the ADC is run at half rate or full rate.

While two VCOs are shown in the embodiment of FIG. 4, other embodiments may use additional VCOs. For example, in an embodiment, a third VCO has a power consumption and jitter specification between VCO1 and VCO2. The third VCO is selected, e.g., when the input signal power is above a predetermined level but not enough dBs above the sensitivity level (high enough SNR) to warrant the higher jitter present in the low power VCO2 but can still tolerate more jitter than the low-jitter VCO1 and thus achieve some power savings. The third VCO is also selected, e.g., in embodiments where the ADC runs at a rate between full rate and half rate. In embodiments the VCO(s) not being used are powered down. For example, VCO1 is powered down when VCO2 is being used and VCO2 is powered down when VCO1 is being used.

Figure 5:
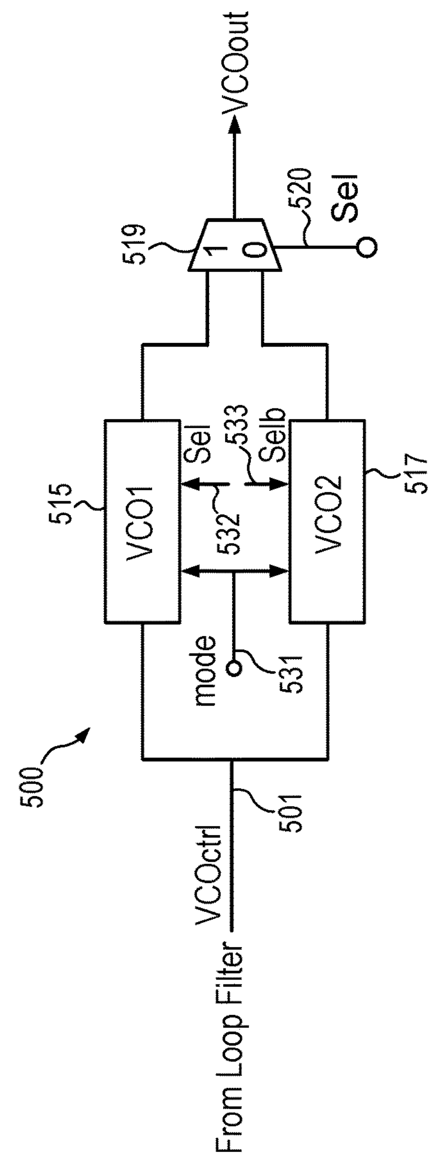
FIG. 5 illustrates a portion of a PLL illustrating control signals for the multiple VCOs.

FIG. 5 illustrates a high level block diagram of a portion of a PLL 500 according to an embodiment. The loop filter supplies an oscillator control signal 501 to VCO1 515 and to VCO2 517. The selector circuit 519 selects the output signal from one of the VCOs as the PLL output signal according to the select signed Sel 520. The oscillators receive a mode signal 531 and VCO1 receives the select signal Sel 532 and VCO2 receives the inverse of Sel (Selb) 533. The select signals 532 and 533 can be independent of select signal 520 or can be related. While two VCOs are illustrated in FIG. 5, other embodiments may use other numbers of VCOs as suitable for the particular application. Thus, embodiments may select between three VCOs with different power and jitter specifications.

FIG. 6*a* illustrates an exemplary block diagram of VCO1 515. The oscillator 515 is a ring oscillator based VCO with a programmable number of inverter stages. The mode signal 531 selects the delay through the ring oscillator by selecting the number of inverter stages. With the mode signal being 1, N1 stages are selected through multiplexer 601. With the mode signal at 0, N2 stages are selected where N1 and N2 are integers. The number of stages selected by the mode signal determines the frequency of the output signal supplied by VCO1 for a given control voltage, Vctl. The select signal 532 determines if the ring oscillator is active. If the select signal is zero NAND gate 602 prevents the oscillator from oscillating. If the select signal is 1, the feedback signal controls the output of NAND gate 602 and the ring oscillator oscillates.

VCO1 utilizes an inverter chain with larger device aspect ratios width/length (W/L), to provide lower jitter/phase noise. The use of inverters with larger W/L aspect ratios causes VCO1 to consume more power as compared to VCO2. VCO1 is for use for the ADC higher clock rate mode and lower jitter. For a given ADC SNR requirement, lower jitter is needed for high-speed (full-rate) ADC mode. VCO1 515 is also selected when the RX chain input power is close to the sensitivity level.

FIG. 6*b* illustrates an exemplary block diagram of oscillator VCO2 517. The oscillator 517 is a ring oscillator based VCO with a programmable number of inverter stages. The mode signal 531 selects the number of inverter stages. With the mode signal being 1, M1 stages are selected through multiplexer 603. With the mode signal at 0, M2 stages are selected where M1 and M2 are different integers. Note that M1 and N1 may be the same or different and M2 and N2 may be the same or different depending on the particular embodiment. The number of stages selected by the mode signal determines the frequency of the output signal supplied by VCO2 for a given control voltage, Vctl. The $\overline{\text{select}}$ signal 533 (selb) determines if the ring oscillator is active. If the $\overline{\text{select}}$ signal is zero NAND gate 604 prevents the oscillator from oscillating. Note that the select 532 is one if $\overline{\text{select}}$ is zero, thus enabling VCO1. If the $\overline{\text{select}}$ signal is 1, the feedback signal controls the output of NAND gate 604 and the ring oscillator oscillates. In an embodiment, the oscillator not being used is powered off to save power instead of just preventing the oscillator from oscillating.

VCO2 utilizes an inverter chain with smaller device aspect ratios W/L as compared to VCO1, to consume less power as compared to VCO1 at the expense of higher jitter. VCO2 is used for the lower clock rate ADC mode. For a given ADC SNR requirement, at lower clock rates higher jitter can be tolerated. Therefore, VCO2 517 is utilized for half rate ADC mode when higher jitter is tolerated and a lower power VCO can be utilized. VCO2 517 is also utilized and when the RX chain input power is high (a threshold number of dB above the sensitivity level).

While FIGS. 6*a* and 6*b* illustrate ring oscillators, other embodiments may use different types of oscillators for VCO1 and VCO2. For example, in another embodiment the oscillators are LC oscillators providing different power consumption and jitter levels.

FIG. 7 illustrates various possible settings for the VCOs illustrated in FIGS. 6*a* and 6*b*. Assertion of the select signal (Sel) 532 selects the VCO1. With the mode=0, the VCO1 is configured to have more inverter stages resulting in a lower oscillation frequency for a given control voltage Vctl. By increasing number of inverter stages when low-rate is selected the control voltage variation across two different frequency settings is reduced. That mode and select setting (1, 0) is appropriate for low-rate, low-jitter applications. A mode and select setting of (1, 1) selects fewer inverter stages for VCO1 and is appropriate for high-rate, low-jitter applications. Deassertion of the select signal (Sel) 532 selects the VCO2. With the mode=0, the VCO2 selects more inverter stages resulting in a lower oscillation frequency for a given control voltage Vctl. Increased number of stages keeps the control voltage shift small between the two oscillation frequencies. That mode and select setting (0, 0) is appropriate for low-rate, low-power, higher jitter applications. A mode and select setting of (0, 1) configures VCO2 to have fewer inverter stages (higher frequency) and is appropriate for high-rate, higher jitter low-power applications. For example, if the input power is sufficiently above the sensitivity level, a higher level of jitter can be tolerated and a low-power VCO can be used.

Referring back to FIG. 4, components of PLL 400 include the charge pump 407 and loop filter 409. FIG. 8 illustrates a conventional loop filter topology for type-II PLLs, which also include higher order poles. The area of the capacitor Cz 801 is typically large and therefore occupies a large area. The additional circuitry 803 is included to provide higher order filtering.

FIG. 9*a* illustrates a passive loop filter 900 having an input impedance $Z_{in}(s)=R_z+1/sC_z$. FIG 9*b* illustrates an active loop filter 902 with capacitor multiplication that reduces the size of the capacitor Cz by a factor N. The resistor 903 is sized at R1=NRz, where Rz is the resistor in FIG. 9*a*. The active loop filter 902 further includes a unity gain buffer 905. The unity gain buffer is an amplifier that functions to cause the output voltage to equal the input voltage, i.e., the unity gain buffer is an amplifier with a gain of one. In the active filter 902, resistor 907 is sized as $$R2 = \frac{N}{N-1}R_z.$$

The active loop filter and the passive loop filter have the same input impedance. That is, the active loop filter also has an input impedance $Z_{in}(s)=R_z+1/sC_z$. The use of the active loop filter allows the capacitor Cz to be reduced in size to Cz/N. Thus, the effective capacitance of the active loop filter with a capacitor C is increased by $C_{eff}=C(1+R1/R2)$. A large N (e.g., N=10), requires a much smaller capacitor for the active filter implementation, thus providing significant capacitor area savings at the cost of additional area and power due the unity gain buffer, additional resistor 907, and larger resistor 903. Resistor area overhead, however, is small as resistors in a loop filter implementation have much smaller area than that of capacitor Cz. In various embodiments, the PLL 400 includes the loop filter 800 (FIG. 8), the loop filter 900, or the loop filter 902, or any appropriate loop filter to generate a control signal to control the VCOs depending on the requirements of the particular application.

Figure 10A:
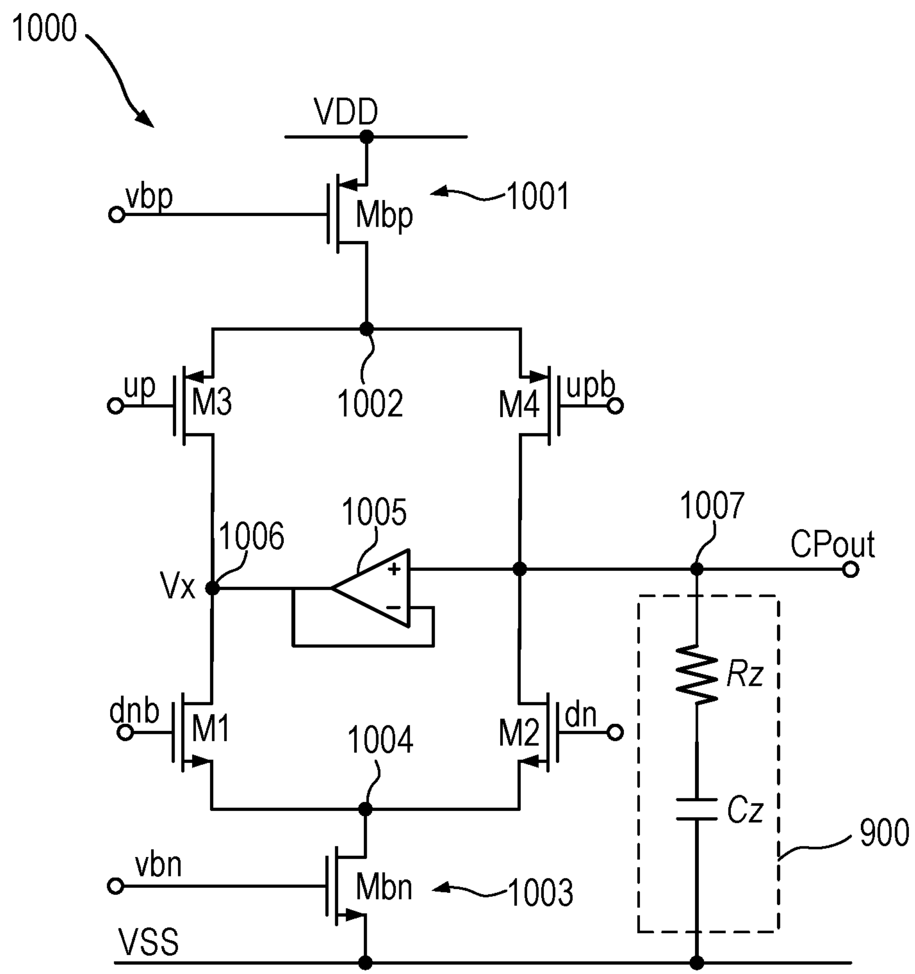
FIG. 10*a* illustrates a conventional charge pump.
Figure 10B:
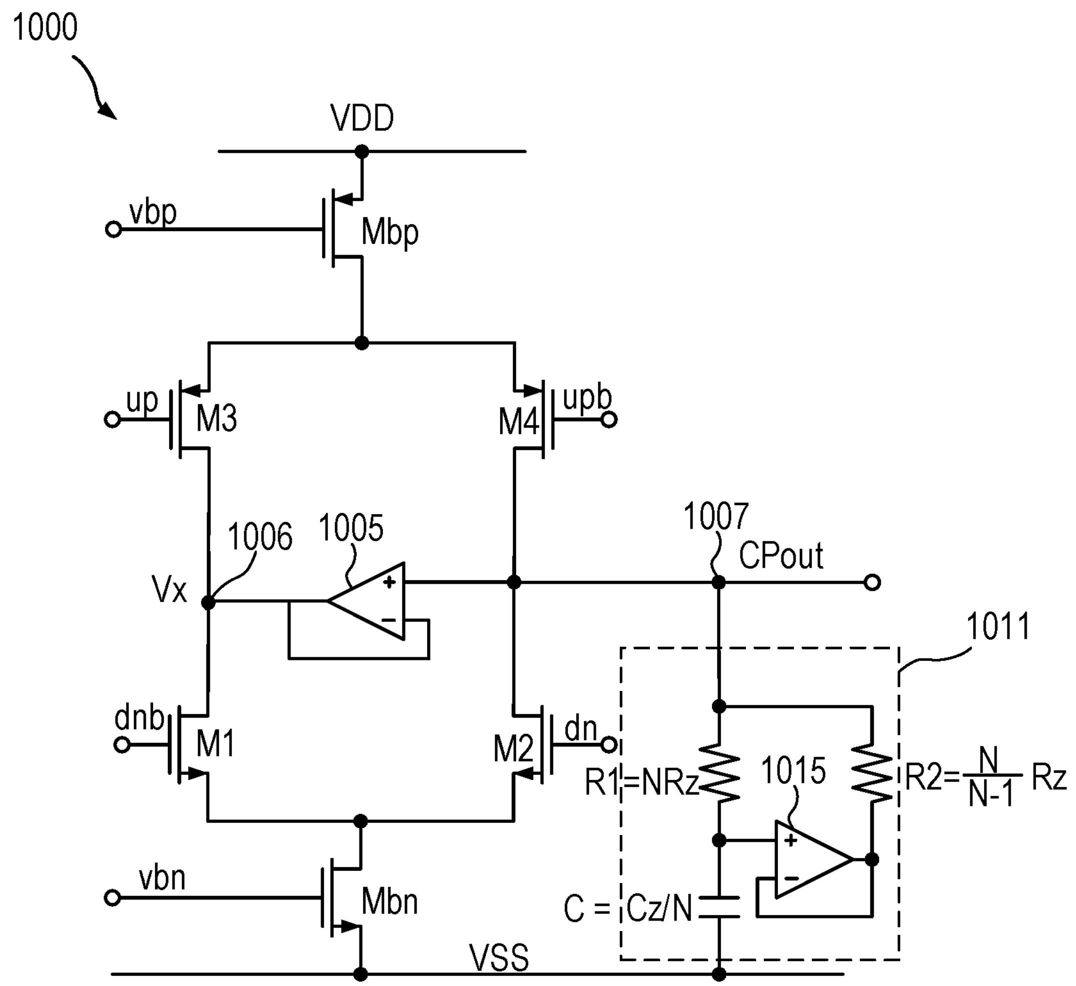
FIG. 10*b* illustrates a charge pump and active loop filter.

In addition to the loop filter, the PLL 400 illustrated in FIG. 4 includes a charge pump 407. FIG. 10*a* illustrates a conventional implementation of a push-pull charge pump 1000 used in an embodiment of PLL 400. The current sources 1001 and 1003 increase or decrease the charge supplied according to the UP and DN signals supplied from PFD 401 (see FIG. 4). The UP and DN signals and their complement are supplied as dnb, dn, up, and upb to respectively control the transistors M1, M2, M3, and M4. The transistors M4 and M2 control the charging or discharging, respectively, of the charge stored in the loop filter capacitor of loop filter 900. Note that transistor pairs M4 and M3 are PMOS transistors controlled (turned ON) by active low gate control signals. The transistors pairs M1 and M2 are NMOS transistors controlled (turned ON) by active high gate control signals. When one transistor of the pair is off, the other of the pair is on. Thus, e.g., when both upb is high and dn is low, and up is low and dnb is high, transistors M3 and M1 are on providing a path between nodes 1002 and 1004. When only upb is asserted (active low) the loop filter capacitor Cz is charged through M4 and transistor M1 is on providing a path between node 1006 and 1004. When only dn is asserted the loop filter capacitor Cz is discharged through M2 and transistor M3 is on providing a path between nodes 1002 and 1006. The unity gain buffer 1005 forces the voltage Vx at node 1006 to follow the voltage on the CPout node 1007 thereby helping minimize offset currents. While FIG. 10*a* shows a simple passive loop filter 900, other embodiments use a higher order loop filter such as the loop filter 800 shown in FIG. 8. While passive loop filters are used in various embodiments, FIG. 10*b* illustrates an embodiment in which an active loop filter 1011 is used in an embodiment with a unity gain buffer 1015. That allows use of a smaller capacitor (Cz/N).

Figure 11:
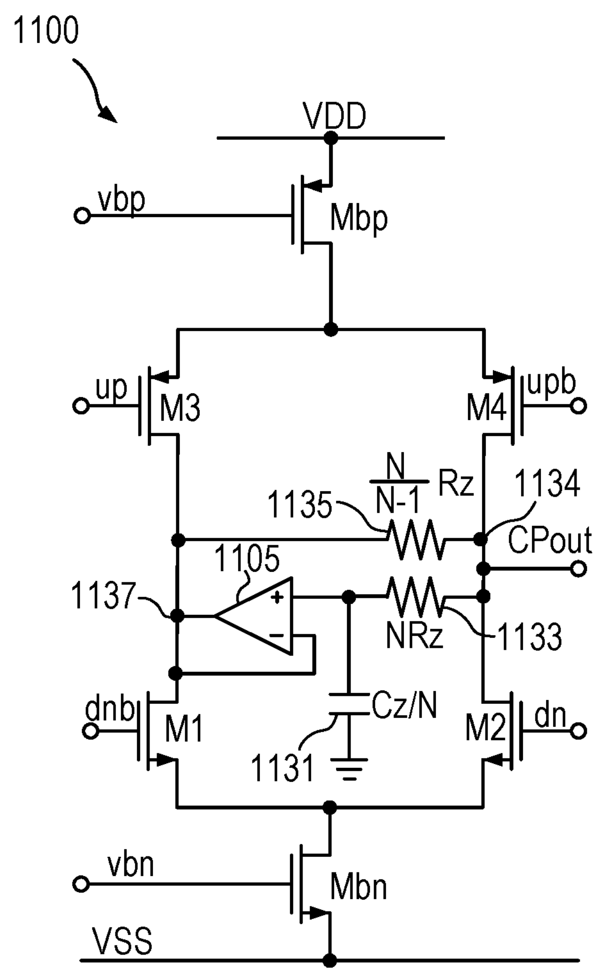
FIG. 11 illustrates a charge pump and loop filter topology according to an embodiment with a shared unity gain buffer.

FIG. 11 illustrates an embodiment having a new charge pump and active loop filter topology 1100 with lower overhead in power and area. The topology can be used in various embodiments described herein but can also be used in PLLs intended for other applications to save area and power. The new charge-pump and loop-filter implementation can reduce loop filter area while keeping overall charge pump and active loop filter current low due to shared use of the unity gain buffer as described below. The embodiment in FIG. 11 includes a charge pump and active loop filter 1100 in which the unity gain buffer 1105 is shared by the charge pump and loop filter, thereby reducing area needed and power consumed by the charge pump and looper filter. In the charge pump and loop filter 1100, with reference also to FIGS. 9*b* and 10*b*, resistor 1133 functions as the loop filter R1=NRz resistor. Resistor 1135 functions as the resistor $$R2 = \frac{N}{N-1}R_z$$

and capacitor 1131 is Cz/N. Thus, the unity gain amplifier 1105 functions as part of the active loop filter allowing the capacitance area of the capacitor 1131 to be reduced as compared to a passive loop filter implementation. The unity gain buffer 1105 also forces the voltage at node 1137 to follow the output voltage CPout on node 1134 to thereby minimize offset currents in the charge pump. Note that FIG. 11 differs somewhat from FIG. 10*b*. For example, in FIG. 10*b* there is no resistor, e.g., resistor 1133, in series between the positive input of the unity gain buffer and CPout. However, for the intended purpose (node 1137 to follow node 1134) the circuit of FIG. 11 is effective. At DC a capacitor is an open circuit therefore the two approaches are identical at low frequencies. Vx (node 1137) on average needs to follow the output (CPout, node 1134) and that is achieved in FIG. 11.

Figure 12:
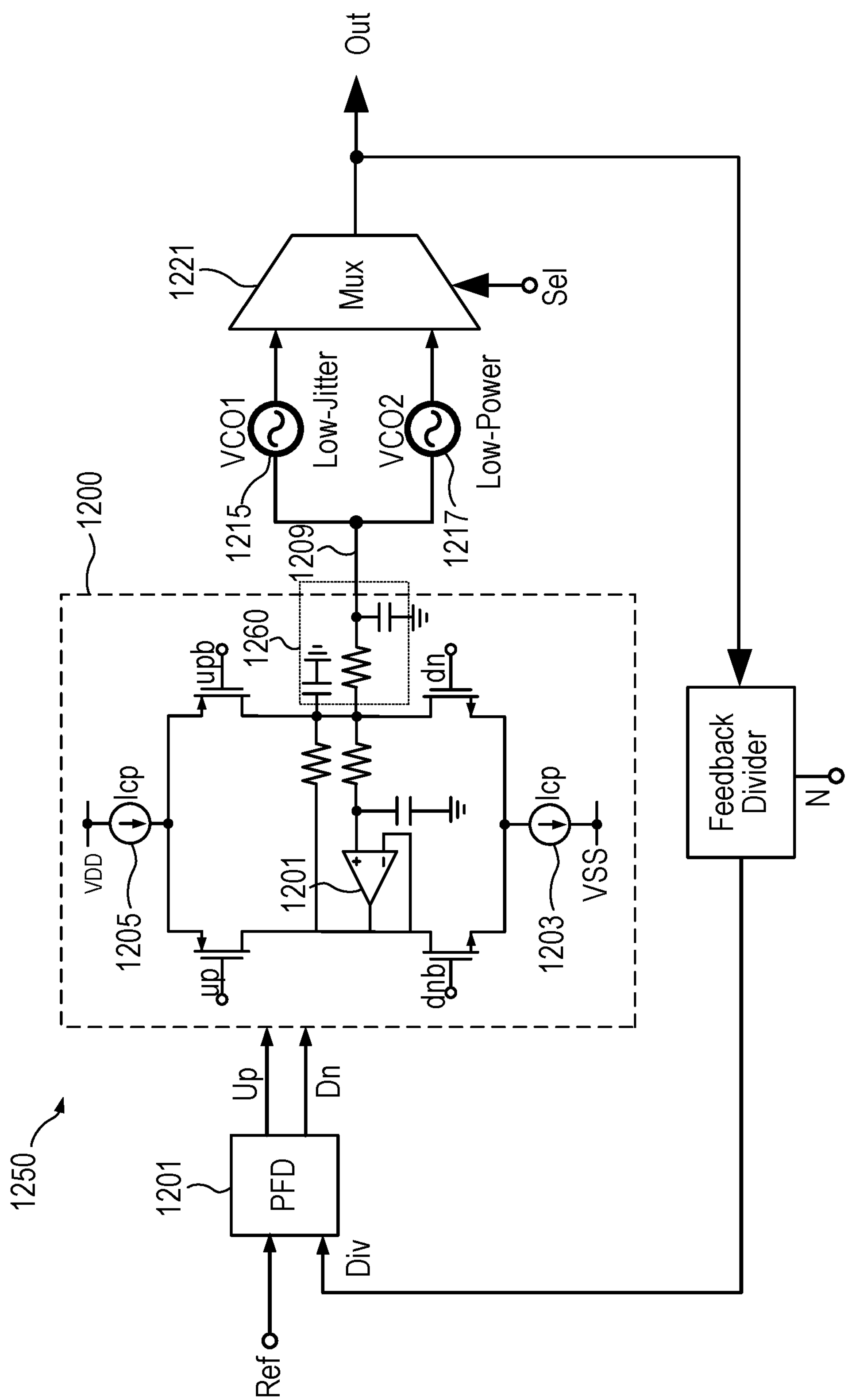
FIG. 12 illustrates use of a charge pump and loop filter topology in an embodiment of a PLL with multiple VCOs.

FIG. 12 illustrates an embodiment of a PLL 1250 in which the charge pump 407 and loop filter 409 of FIG. 4 are replaced by charge pump/loop filter topology 1200 with the shared unity gain buffer 1201. The charge pump/loop filter 1200 is the same as charge pump/loop filter 1100 except that the current sources 1203 and 1205 are shown more symbolically in charge pump/loop filter 1200. In the embodiment of FIG. 12, the loop filter includes the higher order filtering components 1260. The charge pump/loop filter 1200 supplies the VCO control signal 1209 to VCOs 1215 and 1217, one of which is selected by multiplier 1221 to supply the PLL output signal.

Figure 13:
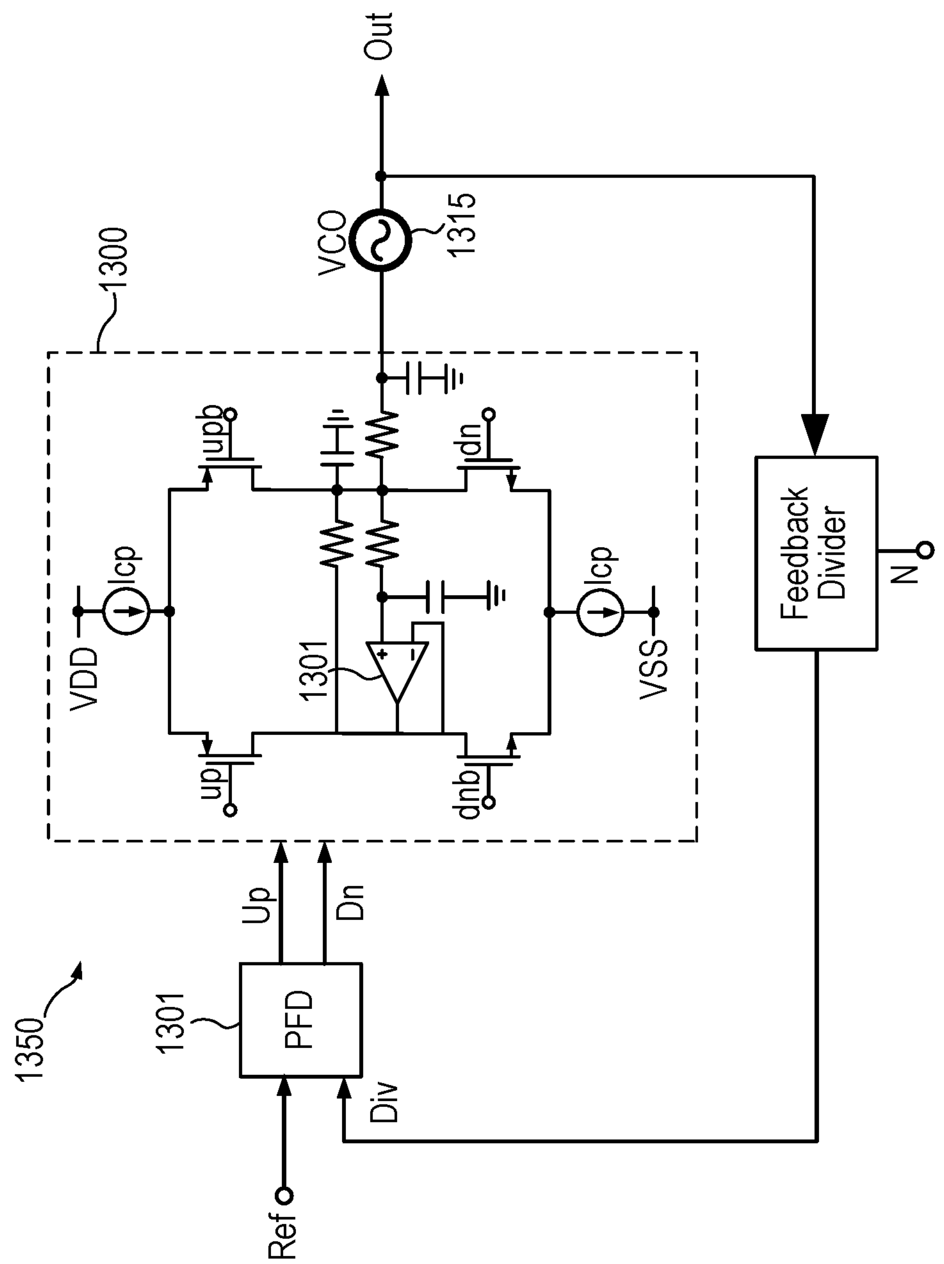
FIG. 13 illustrates use of a charge pump and loop filter topology in an embodiment of a PLL with a single VCO.

FIG. 13 illustrates an embodiment in which the charge pump/loop filter 1300 with the shared unity gain buffer 1301 controls a single VCO 1315 in PLL 1350.

Thus, various aspects have been described related to a charge pump and active loop filter sharing a unity gain buffer. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A phase-locked loop (PLL) comprising:

a charge pump coupled to provide a charge based on a difference between a reference signal and a feedback signal supplied by a phase and frequency detector;

an active loop filter coupled to an output node of the charge pump, the active loop filter providing an effective capacitance of a capacitor (C) in the active loop filter greater than a capacitance of the capacitor in the active loop filter; and a unity gain buffer coupled to be used in the charge pump and in the active loop filter;

wherein the active loop filter includes, first resistor (R1) coupled between a positive input terminal of the unity gain buffer and the output node of the charge pump;

a second resistor (R2) coupled between the output node of the charge pump and an output terminal of the unity gain buffer;

the capacitor (C) is coupled between the positive input terminal of the unity gain buffer and ground; and wherein the effective capacitance is increased over the capacitance of the capacitor based on a ratio of the first resistor to the second resistor.

2. The PLL as recited in claim 1, wherein the charge pump further comprises:

a first current source coupled between a supply voltage and a first node of the charge pump to supply charge to the output node of the charge pump through the first node, through a first transistor, wherein a gate of the first transistor is coupled to a first control signal;

a second current source coupled between a ground voltage and a second node of the charge pump, the second current source to remove charge from a capacitor coupled to the output node, the charge being removed through the second node and through a second transistor coupled between the output node and the second node, wherein a gate terminal of the second transistor is coupled to a second control signal;

a third transistor coupled between the first node and an output terminal of the unity gain buffer, the third transistor having a gate terminal coupled to a complement of the first control signal; and a fourth transistor coupled between the second node and the output terminal of the unity gain buffer, the fourth transistor having a gate terminal coupled to a complement of the second control signal.

3. The PLL as recited in claim 1, wherein the effective capacitance is C(1+R1/R2).

4. The PLL as recited in claim 2, wherein the third and fourth transistors provide a path between the first node of the charge pump and the second node of the charge pump when the first and second transistors are off.

5. The PLL as recited in claim 1, further comprising:

a first voltage controlled oscillator (VCO) coupled to the output node of the charge pump.

6. The PLL as recited in claim 5, further comprising:

a second VCO coupled to the output node of the charge pump.

7. The PLL as recited in claim 1, wherein an input impedance $Z_{in}$ of the active loop filter is $Z_{in}(s)=R_z+1/sC_z$;

the first resistor (R1) is sized as R1=NRz;

the second resistor (R2) is sized as $$R2 = \frac{N}{N-1} R_z;$$

and the capacitor (C) is sized at Cz/N.

8. The PLL as recited in claim 1 further comprising:

higher order filter components coupled to the active loop filter.

9. A method for operating a phase-locked loop (PLL) comprising:

generating signals indicating a difference between a reference signal and a feedback signal in a phase and frequency detector;

supplying the signals indicating the difference to a charge pump;

using a unity gain buffer in the charge pump;

using the unity gain buffer in an active loop filter, the active loop filter increasing an effective capacitance of a loop filter capacitor coupled between a positive input terminal of the unity gain buffer and ground, an increase in the effective capacitance being based on a ratio between a first resistor and a second resistor, the first resistor coupled between a positive input terminal of the unity gain buffer and an output node of the charge pump and the second resistor coupled between the output node of the charge pump and an output terminal of the unity gain buffer; and generating a filtered oscillator control signal using the charge pump and the active loop filter.

10. The method as recited in claim 9, further comprising:

asserting a first control signal to turn on a first transistor to supply charge through a first charge pump node, through the first transistor, to the output node of the charge pump;

asserting a second control signal to turn on a second transistor to remove charge from the loop filter capacitor coupled to the output node while the first transistor is off, the charge being removed through the second transistor and a second charge pump node;

controlling a third transistor using a complement of the first control signal to provide a path from the first charge pump node to a third charge pump node responsive to the third transistor being on;

controlling a fourth transistor using a complement of the second control signal to provide a path from the third charge pump node to the second charge pump node responsive to the fourth transistor being on; and using the unity gain buffer, coupled between the output node and the third charge pump node, to cause voltage on the third charge pump node to track voltage on the output node.

11. The method as recited in claim 10, further comprising:

providing a path between the first charge pump node and the second charge pump node using the third and fourth transistors when the first and second transistors are off.

12. The method as recited in claim 10 wherein on average the voltage on the third charge pump node tracks voltage on the output node.

13. The method as recited in claim 9, further comprising:

controlling a first voltage controlled oscillator (VCO) based on the filtered oscillator control signal.

14. The method as recited in claim 13, further comprising:

selectively controlling a second VCO based on the filtered oscillator control signal.

15. The method as recited in claim 9, wherein an input impedance $Z_{in}$ of the active loop filter is $Z_{in}(s)=R_z+1/sC_z$;

the first resistor is sized as NRz;

the second resistor is sized as $$\frac{N}{N-1}R_z;$$

and the loop filter capacitor is sized at Cz/N.

16. A phase-locked loop (PLL) comprising:

a phase and frequency detector (PFD) to provide PFD signals indicative of a difference between a reference signal and a feedback signal;

a charge pump to supply a current to an output node of the charge pump based on the PFD signals;

an active loop filter coupled to the output node of the charge pump, the active loop filter providing an increased effective capacitance of a capacitor in the active loop filter; and a unity gain buffer coupled as part of the charge pump and the unity gain buffer further coupled as part of the active loop filter;

wherein the charge pump includes, a first transistor coupled between a first current source and the output node of the charge pump;

a second transistor coupled between a second current source and the output node of the charge pump;

a third transistor coupled between the first current source and an output terminal of the unity gain buffer;

a fourth transistor coupled between the output terminal of the unity gain buffer and the second current source;

wherein a positive input terminal of the unity gain buffer is coupled to the output node of the charge pump through a first resistor of the active loop filter;

a second resistor of the active loop filter is coupled between the output node of the charge pump and the output terminal of the unity gain buffer; and the capacitor of the active loop filter is coupled between the positive input terminal of the unity gain buffer and ground.

17. The PLL as recited in claim 16, further comprising:

a first voltage controlled oscillator (VCO) coupled to the output node of the charge pump.

18. The PLL as recited in claim 17, further comprising:

a second VCO coupled to the output node of the charge pump.

19. The PLL as recited in claim 17, wherein the first transistor is coupled to receive a first gate control signal;

the second transistor is coupled to receive a second gate control signal;

the third transistor is coupled to receive a complement of the first gate control signal; and the fourth transistor is coupled between the third transistor and the second current source and is coupled to receive a complement of the second gate control signal.

20. The PLL as recited in claim 17, wherein the third and fourth transistors provide a path between the first current source and the second current source when the first and second transistors are off.

* * * * *